United States Patent
Osawa

(10) Patent No.: US 8,230,901 B2
(45) Date of Patent: Jul. 31, 2012

(54) ELECTRONIC DEVICE COOLING APPARATUS

(75) Inventor: Satoshi Osawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1483 days.

(21) Appl. No.: 11/368,450

(22) Filed: Mar. 7, 2006

(65) Prior Publication Data

US 2007/0119571 A1    May 31, 2007

(30) Foreign Application Priority Data

Nov. 30, 2005    (JP) ................. 2005-346067

(51) Int. Cl.
F28F 7/00    (2006.01)
F28D 13/00    (2006.01)
F28D 15/00    (2006.01)

(52) U.S. Cl. ......... 165/80.2; 165/80.4; 165/104.13; 165/104.15; 165/104.16; 165/104.33; 257/712

(58) Field of Classification Search ........... 165/80.2, 165/80.3, 80.4, 80.5, 104.13, 104.15, 104.16, 165/104.26, 104.33; 257/712, 713, 678; 438/106
See application file for complete search history.

(56) References Cited

U.S. PATENT DOCUMENTS

| | | | | |
|---|---|---|---|---|
| 3,820,596 A | * | 6/1974 | Weinhardt et al. | 165/104.26 |
| 4,193,445 A | * | 3/1980 | Chu et al. | 165/80.3 |
| 4,531,146 A | * | 7/1985 | Cutchaw | 257/713 |
| 4,612,978 A | * | 9/1986 | Cutchaw | 165/104.33 |
| 4,694,378 A | * | 9/1987 | Nakayama et al. | 165/80.4 |
| 4,730,665 A | * | 3/1988 | Cutchaw | 165/80.4 |
| 4,759,404 A | * | 7/1988 | Henson et al. | 165/104.13 |
| 4,823,863 A | * | 4/1989 | Nakajima et al. | 165/80.4 |
| 4,884,169 A | * | 11/1989 | Cutchaw | 165/80.4 |
| 5,119,021 A | * | 6/1992 | Taraci et al. | 165/80.4 |
| 5,198,889 A | * | 3/1993 | Hisano et al. | 257/678 |
| 5,789,813 A | * | 8/1998 | Kirkland et al. | 257/712 |
| 5,885,848 A | * | 3/1999 | Kirkland et al. | 438/106 |
| 6,679,318 B2 | * | 1/2004 | Bakke | 165/104.33 |
| 7,137,443 B2 | * | 11/2006 | Rosenfeld et al. | 165/104.26 |

FOREIGN PATENT DOCUMENTS

| | | |
|---|---|---|
| JP | 60-000761 | 1/1985 |
| JP | 10-213370 | 8/1998 |
| JP | 2003-78092 | 3/2003 |
| JP | 2004-031503 | 1/2004 |
| JP | 2004-134423 | 4/2004 |
| JP | 2005-273617 | 10/2005 |

OTHER PUBLICATIONS

Japanese Office Action mailed Aug. 10, 2010 issued with respect to corresponding Japanese Patent Application No. 2005-346067.

* cited by examiner

Primary Examiner — Ljiljana Ciric
(74) Attorney, Agent, or Firm — Staas & Halsey LLP

(57) ABSTRACT

An electronic device cooling apparatus includes a cooling unit that is thermally connected to an electronic device and is configured to induce heat generated from the electronic device to be conducted to a cooling medium that is channeled into the cooling unit; and a heat dissipating unit including a cooling chamber configured to cool the cooling medium that is heated by the heat conducted from the electronic device. The cooling unit and the heat dissipating unit are integrated.

7 Claims, 3 Drawing Sheets

ELECTRONIC DEVICE COOLING APPARATUS

BACKGROUND OF THE INVENTION

1. Field of the Invention

The present invention relates to an electronic device cooling apparatus that performs a cooling process on an electronic device using a cooling medium.

2. Description of the Related Art

In recent years and continuing, techniques are being developed for increasing the density and speed of an electronic device such as a semiconductor device, and in turn, techniques for properly processing heat generated from such an electronic device have to be considered. Specifically, heat generated from an electronic device increases as the density and speed of the electronic device are increased, and as a result, such heat may not be adequately processed through natural heat dissipation using a heat dissipating fin, for example. Accordingly, a cooling apparatus is used to realize forced cooling of the electronic device (e.g., see Japanese Laid-Open Patent Publication No. 10-213370).

FIG. 1 is a diagram showing an exemplary configuration of a cooling apparatus. The cooling apparatus 1 shown in FIG. 1 includes a cooling unit 2, a heat dissipating unit 3, a tank 4, a pump 5, and pipes 8A-8C. The tank 4 stores cooling water as a cooling medium, and the pump 5 transfers the cooling water from the tank 4 to the pipe 8B connected to the cooling unit 2 by suction.

The cooling unit 2 includes a bent cooling pipe (not shown) arranged within a housing. The cooling unit 2 is thermally connected to an electronic device 6 (e.g., electronic element) corresponding to a heat generating element. Heat generated at the electronic device 6 is conducted to the cooling water that flows through the bent cooling pipe via the housing. In this way, the electronic device 6 may be cooled by the cooling unit 2.

The cooling unit 2 and the heat dissipating unit 3 are interconnected by the pipe 8C. The cooling water that is heated at the cooling unit 2 is transferred to the heat dissipating unit 3. The heat dissipating unit 3 includes a bent heat exchange pipe (not shown) and a fan 11, and cooling air generated by the fan 11 is directed to the bent heat exchange pipe.

In such an arrangement, the heat of the cooling water is converted into the heat of the cooling air, and in this way, the temperature of the cooling water may be lowered. The cooling water with the lowered temperature is then transferred via the pipe 8D back to the tank 4 to be stored therein. The cooling water circulates within the cooling apparatus 1 in the manner described above, and the electronic device 6 may be cooled in such a circulation process.

However, it is noted that in the cooling apparatus 1 of FIG. 1, the cooling unit 2, the heat dissipating unit 3, the tank 4, and the pump 5 are independently arranged, and thereby, four relatively long pipes 8A-8D have to be used to interconnect the respective components 2-5 of the cooling apparatus 1.

When the pipes 8A-8D are relatively long, heat absorption and heat emission may occur at relatively high rates while the cooling water is channeled through the pipes 8A-8D so that the heat efficiency of the cooling apparatus 1 may be degraded. As a consequence, the electronic device 6 may not be properly cooled, and proper operation of the electronic device 6 may be hampered.

Also, when the pipes 8A-8D are relatively long, pressure loss occurring within the pipes 8A-8D may be increased while the cooling water is circulated between the components 2-5 of the cooling apparatus 1, and thereby, a high performance pump has to be used as the pump 5. In turn, a large pump has to be used as the pump 5, and the overall size of the cooling apparatus 1 may be increased as a result.

SUMMARY OF THE INVENTION

According to a preferred embodiment of the present invention, a miniaturized electronic device cooling apparatus is provided that is capable of efficiently cooling an electronic device.

An electronic device cooling apparatus according to a preferred embodiment of the present invention includes:

a cooling unit that is thermally connected to an electronic device and is configured to induce heat generated from the electronic device to be conducted to a cooling medium that is channeled into the cooling unit; and a heat dissipating unit including a cooling chamber configured to cool the cooling medium that is heated by the heat conducted from the electronic device;

wherein the cooling unit and the heat dissipating unit are integrated.

According to an aspect of the present embodiment, by integrating the cooling unit and the heat dissipating unit, the cooling apparatus may be miniaturized compared to a case in which the cooling unit and the heat dissipating unit are independently arranged. Also, according to another aspect of the present embodiment, heat resistance between the cooling unit and the heat dissipating unit may be reduced so that heat of the cooling unit from cooling the electronic device may be efficiently dissipated by the heat dissipating unit and the electronic device may be efficiently cooled.

In a preferred embodiment, the cooling medium used in the electronic device cooling apparatus according to an embodiment of the present invention includes a metal filler.

According to an aspect of the present embodiment, by including the metal filler in the cooling medium, heat conductivity of the cooling medium may be increased compared to a case in which the metal filler is not included in the cooing medium, and heat exchange between the electronic device and the cooling medium may be accurately realized.

In another preferred embodiment, the electronic device cooling apparatus according to an embodiment of the present invention includes:

a filter that is arranged at a location within the cooling chamber at which location the cooling medium is discharged, the filter being configured to prevent the metal filler from being discharged from the cooling chamber.

According to an aspect of the present embodiment, the filter may prevent the metal filler from being discharged from the cooling chamber, and thereby, a decrease in heat conductivity of the cooling medium may be prevented and inconveniences arising from the metal filler being adhered to the pump used for circulating the cooling medium may be prevented, for example.

In another preferred embodiment, the heat dissipating unit of the electronic device cooling apparatus according to an embodiment of the present invention includes:

an internal heat sink that is arranged inside the cooling chamber, the internal heat sink including one end that is thermally connected to an inner wall of the cooling chamber, and another end that extends to the cooling medium accommodated in the cooling chamber; and an external heat sink that is arranged outside the cooling chamber, the external heat sink including one end that is thermally connected to an outer wall of the cooling chamber, and another end that extends outward with respect to the cooling chamber.

According to one aspect of the present embodiment, heat of the cooling medium may be conducted to the internal heat sink arranged inside the cooling chamber so that heat dissipation may be accurately performed in a shorter period of time compared to a case in which the internal heat sink is not provided and the heat of the cooling medium is arranged to be directly conducted to the wall of the cooling chamber.

In another preferred embodiment, the electronic device cooling apparatus according to an embodiment of the present invention includes:

a stirring device configured to stir the cooling medium accommodated in the cooling chamber.

According to an aspect of the present embodiment, the cooling medium accommodated within the cooling chamber may be stirred by the stirring device so that stagnation of the cooling medium within the cooling chamber may be prevented and a decrease in cooling efficiency may be prevented.

DESCRIPTION OF THE PREFERRED EMBODIMENTS

In the following, preferred embodiments of the present invention are described with reference to the accompanying drawings.

Figure 2:
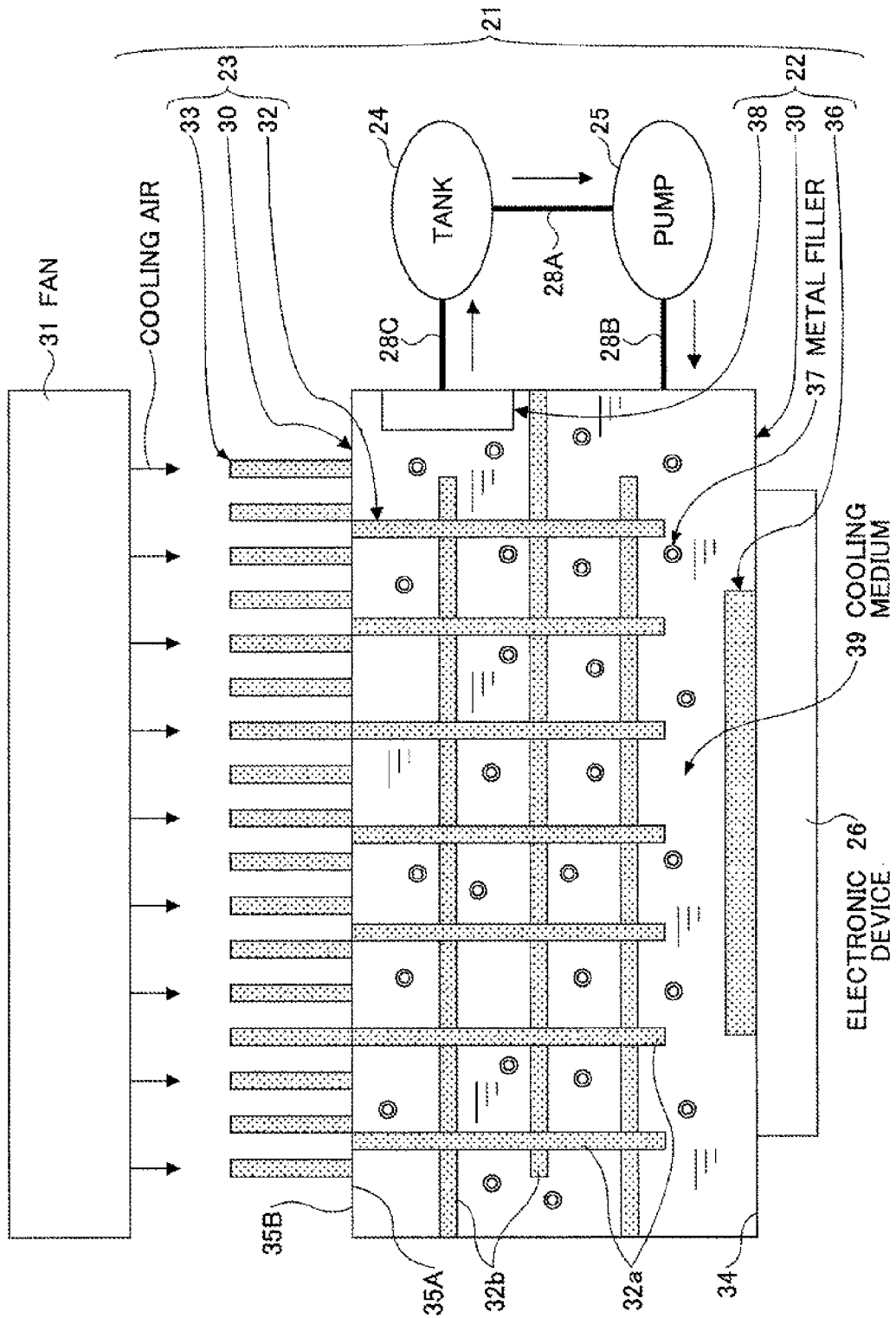
FIG. 2 is a diagram showing a configuration of an electronic device cooling apparatus according to an embodiment of the present invention.

FIG. 2 is a diagram illustrating a configuration of a cooling apparatus 20 for cooling an electronic device according to an embodiment of the present invention. The cooling apparatus 20 of FIG. 2 includes a cooling/heat dissipating mechanism 21, a tank 24, a pump 25, and a fan 31, for example. In the illustrated example, the cooling apparatus 20 is configured to cool an electronic device 26. The electronic device 26 that is cooled by the cooling apparatus 20 may be a semiconductor device that generates heat during operation, for example. However, it is noted that the present invention is not limited to such an example, and the cooling apparatus 20 may be used to cool other various types of electronic devices.

The tank 24 stores a cooling medium 39. The pump 25 transfers the cooling medium 39 from the tank 24 through a cooling passage 28A by suction and sends the cooling medium 39 to the cooling/heat dissipating mechanism 21 via a cooling passage 28B. Then, after being used in a cooling process for cooling the electronic device 26 at the cooling/heat dissipating mechanism 21, the cooling medium 39 is transferred back to the tank 24 via a cooling passage 28C to be stored in the tank 24.

The cooling/heat dissipating mechanism 21 includes a cooling unit 22 and a heat dissipating unit 23. The cooling unit 22 is thermally connected to the electronic device 26 corresponding to an object to be cooled, and the cooling unit 22 is configured to cool the electronic device 26. The heat dissipating unit 23 is configured to cool the cooling medium 39 that is heated by the heat conducted from the electronic device 26.

The cooling unit 22 is realized by a housing 30, a stirring device 36, and a filter 38, for example. The heat dissipating unit 23 is realized by the housing 30, an internal heat sink 32, and an external heat sink 33, for example.

In the following, the components of the cooling unit 22 are described. It is noted that the housing 30 commonly houses the cooling unit 22 and the heat dissipating unit 23. The housing 30 is a liquid-tight structure that is rectangular in shape and is made of metal with good heat conductivity, for example. A bottom portion 34 of the housing 30 is arranged to be in contact with an upper face of the electronic device 26, and in this way, the thermal connection between the housing 30 and the electronic device 26 is realized.

The housing 30 accommodates the internal heat sink 32 (described below in relation to the heat dissipating unit 23), the stirring device 36, and the filter 38. The cooling medium 39 is arranged to be introduced into the housing 30. The external heat sink 33 is arranged at a top plate outer wall 35B of the housing 30.

The stirring device 36 is arranged at the bottom portion 34 of the housing 30. The stirring device 36 is configured to stir the cooling medium 39 that is introduced into the housing 30. Specifically, the stirring device 36 includes a wing and a motor for rotating the wing, and the cooling medium 39 within the housing 30 may be stirred through rotation of the wing of the stirring device 36. By providing the stirring device 36 within the housing 30, temperature stagnation of the cooling medium 39 within the housing 30 may be prevented, and cooling efficiency for cooling the electronic device 26 may be improved. Also, the stirring device 36 may prevent a metal filler 37 from settling at the bottom portion 34 of the housing 30 (described in detail below).

In the following, the filter 38 and the cooling medium 39 are described. It is noted that in the illustrated example, water is used as the cooling medium 39. It is noted that the metal filler 37 is mixed into the metal cooling medium 39.

Figure 3:
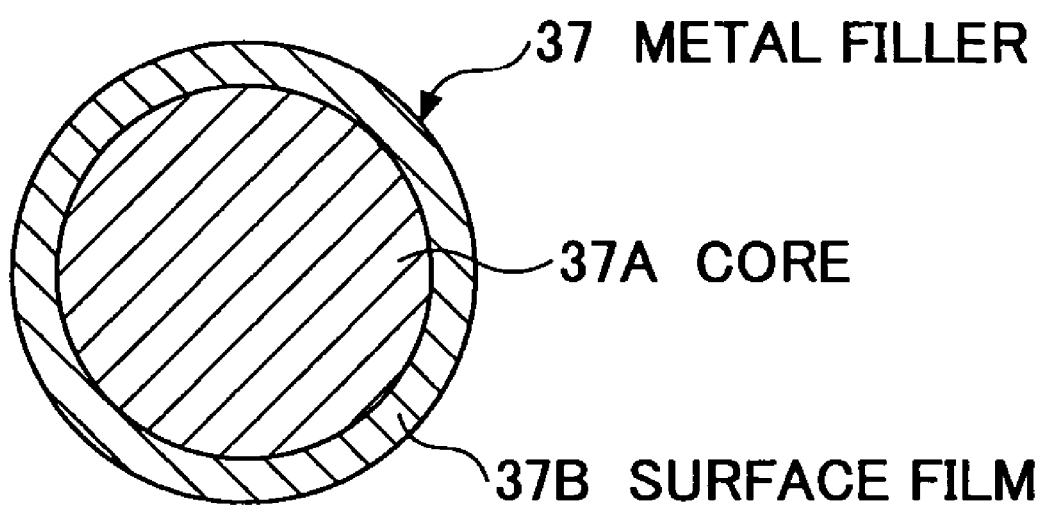
FIG. 3 is a cross-sectional diagram of a metal filler.

FIG. 3 is a cross-sectional diagram of the metal filler 37. As is shown in this drawing, the metal filler 37 includes a core 37A and a surface film 37B (coating) that is arranged over the peripheral surface of the core 37A. In the illustrated example, copper having high thermal conductivity is used as the material of the core 37A, and nickel or titanium having high friction resistance is used as the material of the surface film 37B.

By mixing the metal filler 37 having high thermal conductivity in the cooling medium 39, the overall thermal conductivity of the cooling medium 39 may be increased compared to a case in which the metal filler 37 is not mixed into the cooling medium 39. Accordingly, heat generated at the electronic device 26 may be efficiently conducted to the cooling medium 39 having the metal filler 37 mixed therein. In turn, heat exchange between the electronic device 26 and the cooling/heat dissipating mechanism 21 may be efficiently realized in a short period of time.

Also, it is noted that the specific gravity of the metal filler 37 is greater than that of water, and thereby, the metal filler 37 is prone to sink with respect to the cooling medium 39 (i.e., water). The cooling medium 39 is arranged to be pressurized by the pump 25 to be introduced into the lower portion of the housing 30 via the cooling passage 28B, and discharged from the housing 30 to the tank 24 via the cooling passage 28C arranged at the upper portion of the housing 30. It is noted that the flow speed of the cooling medium 39 realized by the pressure from the pump 25 is not sufficient for adequately stirring the metal filler 37 included in the cooling medium 39 within the housing 30.

Accordingly, in the present embodiment, the stirring device 36 is arranged within the housing 30 of the cooling/heat dissipating mechanism 21 so that the stirring device 36 may stir the sinking metal filler 37 contained in the cooling medium 39. In this way, the metal filler 37 may be evenly distributed in the cooling medium 39 accommodated in the housing 30.

The filter 38 is configured to filter out the metal filler 37 from the cooling medium 39. Specifically, the filter is arranged to enable the cooling medium 39 to pass therethrough while blocking the passage of the metal filler 37. The filter 38 is arranged at a predetermined location of the housing 30 at which the cooling medium 39 flows into the cooling passage 28C. In this way, the metal filler 37 may be prevented from flowing into the tank 24 and the pump 25.

It is noted that if the filter 38 is not arranged at the predetermined location of the housing 30, the metal filler 37 may flow into the tank 24 and the pump 25. When the metal filler 37 flows into the tank 24 and settles at the bottom of the tank 24, the storage capacity of the tank 24 for storing the cooling medium 39 may be reduced, and additional maintenance procedures may be required for removing the metal filler 37 settled at the bottom of the tank 24, for example. Also, the amount of the metal filler 37 in the housing 30 may be reduced and the heat dissipating effects on the electronic device 26 realized by the housing 30 may be reduced. Further, the metal filler 37 may be adhered to the pump 25 in which case the cooling medium 39 may not be properly transferred.

Accordingly, in the present embodiment, the filter 38 is arranged at a location where the cooling medium 39 and the metal filler 37 are being channeled toward the tank 24; that is, the filter 38 is arranged at the connecting position between the housing 30 and the cooling passage 28C. In this way, the metal filler 37 may be prevented from being discharged out of the housing 30, and thermal conductivity of the cooling medium 39 including the metal filler 37 accommodated in the housing 30 may be prevented from being degraded. Also, inconveniences arising from the metal filler 37 settling at the tank 24 or being adhered to the pump 25 may be prevented.

In the following, the heat dissipating unit 23 is described. The internal heat sink 32 of the heat dissipating unit 23 includes plural column members 32a and 32b that are made of a material that has high thermal conductivity such as copper or aluminum. It is noted that the ends of the column members 32a and 32b on one side are fixed to an inner wall of the housing 30 with wax, for example, and the ends of the column members 32a and 32b on the other side are arranged to extend towards the opposing inner wall of the housing 30. According to such an arrangement, the column members 32a and 32b may be thermally connected to the housing 30 at their fixed ends.

More specifically, as is shown in FIG. 2, the columns 32a are arranged to extend vertically in a downward direction from a top plate inner wall 35A of the housing 30. The column members 32b are arranged to extend horizontally from a side plate inner wall of the housing 30. The columns 32a and 32b are arranged into a lattice structure in side view.

The external heat sink 33 is arranged at the top plate outer wall 35B of the housing 30. The external heat sink 33 includes plural heat dissipating fins for increasing the heat dissipating efficiency that extend in the upper direction in FIG. 2. It is noted that the lower end of each heat dissipating fin is fixed to the top plate outer wall 35B with wax, for example, and the other end of the heat dissipating fin is arranged to extend in the upper direction.

The fan 31 is arranged opposite the external heat sink 33 (e.g., upper side of the external heat sink 33 in FIG. 2). The fan 31 is configured to blow cooling air towards the external heat sink 33, and in this way, the heat dissipating efficiency of the external heat sink 33 may be improved.

In the following, operations of the cooling apparatus 20 are described. When the pump 25 is activated, the cooling medium 39 stored in the tank 24 (at this point, the metal filler 37 is not yet included in the cooling medium 39) is introduced into the housing 30 via the cooling passage 28A and the cooling passage 28B by the suction force induced by the pump 25.

The stirring device 36 is arranged to be activated in accordance with the activation of the pump 25. The metal filler 37 is accommodated in the housing 30 beforehand. When the cooling medium 39 is introduced into the housing 30 by the pump 25, the cooling medium 39 is stirred by the stirring device 36 so that the metal filler 37 may be evenly distributed within the housing 30.

Thus, heat generated at the electronic device 26 is conducted to the cooling medium 39 and the metal filler 37 via the bottom portion 34 of the housing 30. In this way, heat exchange between the electronic device 26 and the cooling/heat dissipating mechanism 21 may be realized, and the electronic device 26 may be cooled.

The metal filler 37 and the cooling medium 39 that is heated as a result of the heat exchange as is described above are stirred by the forces applied thereto by the pump 25 and the stirring device 36. Also, as is described above, since the internal heat sink 32 is arranged inside the housing 30, the metal filler 37 and the cooling medium 39 may collide with the internal heat sink 32, and in this way, heat of the metal filler 37 and the cooling medium 39 may be conducted to the internal heat sink 32. By realizing the heat exchange between the cooling medium 39 including the metal filler 37 and the internal heat sink 32, the temperature of the metal filler 37 and the cooling medium 39 is reduced and the temperature of the heat sink 32 is increased.

Since the ends of the column members 32a and 32b are fixed to the housing 30, the heat conducted from the cooling medium 39 to the heat sink 32 is conducted to the housing 30 via the column members 32a and 32b. The heat conducted to the housing 30 is then dissipated into the atmosphere via the external heat sink 33. In the present embodiment, the fan 31 is arranged to provide cooling air to the external heat sink 33, and thereby, heat dissipation by the heat sink 33 may be efficiently performed.

Figure 1:
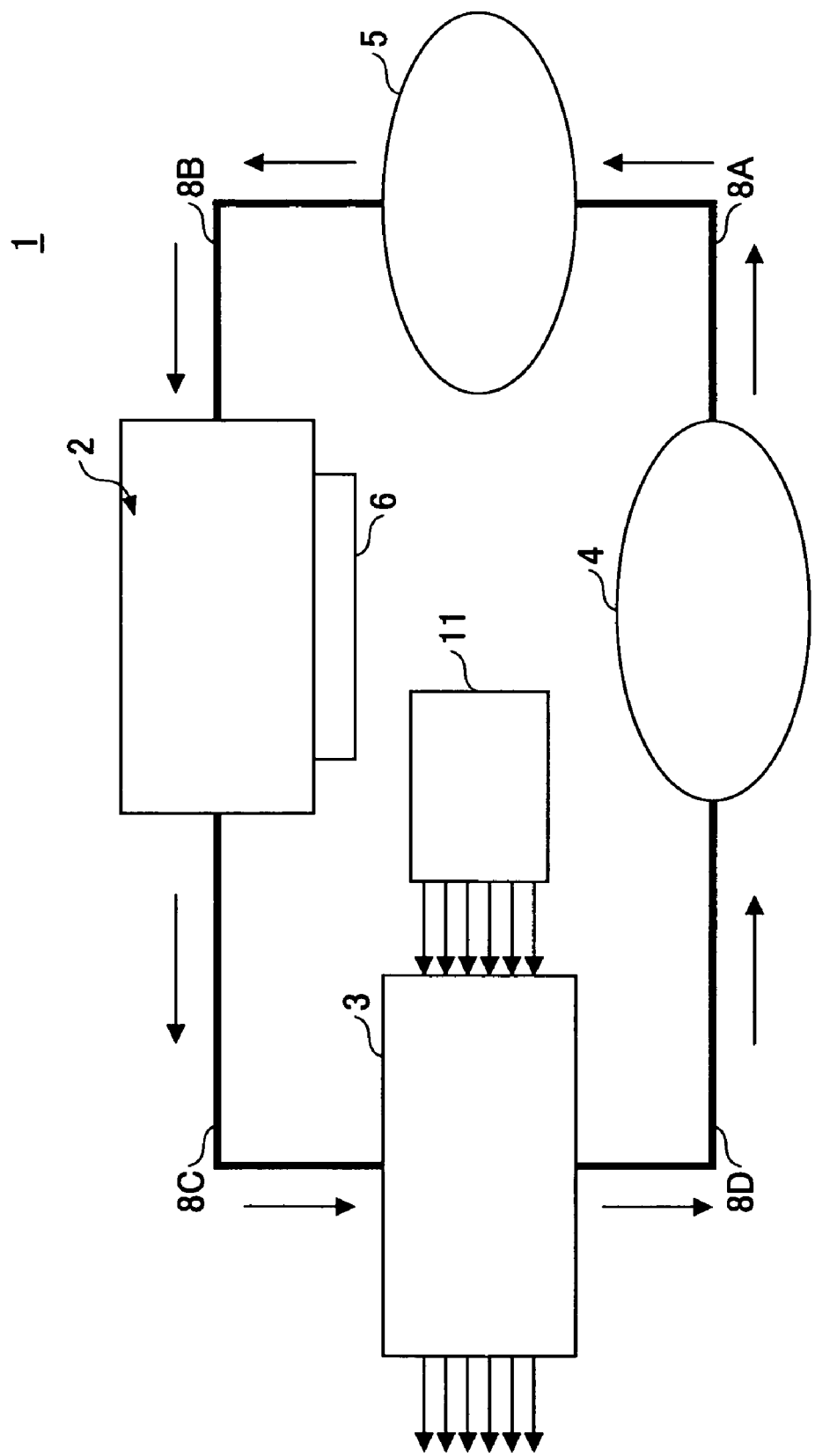
FIG. 1 is a diagram showing an exemplary configuration of an electronic device cooling apparatus.

As can be appreciated from the above descriptions, in the cooling apparatus 20 according to a preferred embodiment of the present invention, the cooling unit 22 and the heat dissipating unit 23 are integrated within the housing 30. Accordingly, the cooling apparatus 20 may be miniaturized compared to a case in which the cooling unit and the heat dissipating unit are independently arranged (e.g., see FIG. 1). Also, since the cooling apparatus 20 according to the present embodiment does not have to arrange a pipe between the cooling unit 22 and the heat dissipating unit 23 as in the example of FIG. 1 in which the pipe 8C is arranged between the cooling unit 2 and the heat dissipating unit 3, heat resistance between the cooling unit 22 and the heat dissipating unit 23 may be reduced. In this way, the heat of the cooling unit 22 from cooling the electronic device 26 may be immediately dissipated at the heat dissipating unit 23 so that the electronic device 26 may be efficiently cooled.

Also, in the present embodiment, the internal heat sink 32 is arranged within the housing 30, and thereby, heat conduction between the cooling medium 39 including the metal filler 37 and the external heat sink 33 may be smoothly performed in a short period of time. In this way, heat dissipation (heat exchange) of the heat of the metal filler 37 and the cooling medium 39 may be accurately performed in a short period of time compared to a case in which the internal heat sink 32 is not arranged in the housing 30.

Further, the present invention is not limited to these embodiments, and variations and modifications may be made without departing from the scope of the present invention.

The present application is based on and claims the benefit of the earlier filing date of Japanese Patent Application No. 2005-346067 filed on Nov. 30, 2005, the entire contents of which are hereby incorporated by reference.

What is claimed is:

1. An electronic device cooling apparatus comprising:
   a cooling unit that is thermally connected to an electronic device and is configured to induce heat generated from the electronic device to be conducted to a cooling medium that is channeled into said cooling unit;
   a heat dissipating unit including a cooling chamber configured to cool the cooling medium that is heated by the heat conducted from the electronic device; and
   a housing that commonly houses the cooling unit and the heat dissipating unit;
   wherein the cooling unit and the heat dissipating unit are integrated;
   wherein the housing is a part of both the cooling unit and the heat dissipating unit.

2. The electronic device cooling apparatus as claimed in claim 1, wherein the cooling medium includes a metal filler.

3. The electronic device cooling apparatus as claimed in claim 2, further comprising:
   a filter that is arranged at a location within the cooling chamber at which location the cooling medium is discharged, the filter being configured to prevent the metal filler from being discharged from the cooling chamber.

4. The electronic device cooling apparatus as claimed in claim 2, wherein
   the metal filler includes a metal core having heat conductivity and a surface film covering a surface of the metal core which surface film has friction resistance.

5. The electronic device cooling apparatus as claimed in claim 4, wherein
   the metal core is made of copper, and the surface film is made of at least one of nickel and titanium.

6. The electronic device cooling apparatus as claimed in claim 1, wherein
   the heat dissipating unit includes
   an internal heat sink that is arranged inside the cooling chamber, the internal heat sink including one end that is thermally connected to an inner wall of the cooling chamber, and another end that extends to the cooling medium accommodated in the cooling chamber; and
   an external heat sink that is arranged outside the cooling chamber, the external heat sink including one end that is thermally connected to an outer wall of the cooling chamber, and another end that extends outward with respect to the cooling chamber.

7. The electronic device cooling apparatus as claimed in claim 1, further comprising:
   a stirring device configured to stir the cooling medium accommodated in the cooling chamber.

* * * * *